(12) United States Patent
Chan

(10) Patent No.: US 7,677,763 B2
(45) Date of Patent: Mar. 16, 2010

(54) METHOD AND SYSTEM FOR ATTACHMENT OF LIGHT EMITTING DIODES TO CIRCUITRY FOR USE IN LIGHTING

(76) Inventor: Timothy Chan, 200 Rector Pl., #23H, New York, NY (US) 10280

( * ) Notice: Subject to any disclaimer, the term of this patent is extended or adjusted under 35 U.S.C. 154(b) by 293 days.

(21) Appl. No.: 11/541,314

(22) Filed: Sep. 29, 2006

(65) Prior Publication Data

US 2007/0025103 A1 Feb. 1, 2007

Related U.S. Application Data

(63) Continuation-in-part of application No. 10/969,686, filed on Oct. 20, 2004.

(51) Int. Cl.
*F21V 21/00* (2006.01)
*F21S 4/00* (2006.01)
*F21V 29/00* (2006.01)

(52) U.S. Cl. .................. 362/249.02; 362/373; 362/800; 362/217.16; 362/217.17; 362/217.14

(58) Field of Classification Search ................. 362/252, 362/373, 800, 249.02, 217.14–217.17; 439/43–48, 439/52, 53, 113–115, 119, 151, 207–213, 439/374, 378–381, 485, 487, 515, 525–526, 439/604–606, 620.01–620.02, 620.21–620.25
See application file for complete search history.

(56) References Cited

U.S. PATENT DOCUMENTS

| | | | |
|---|---|---|---|
| 4,959,761 A | 9/1990 | Critelli et al. | |
| 5,058,900 A | 10/1991 | Denen | |
| 5,299,096 A | 3/1994 | Ishimatsu | |
| 5,440,468 A | 8/1995 | Savage, Jr. | |
| 5,513,082 A | 4/1996 | Asano | |
| 6,167,648 B1 | 1/2001 | Dimmick | |
| 6,257,736 B1 | 7/2001 | Fehrenbach | |
| 6,345,902 B2 | 2/2002 | Ohkohdo et al. | |
| 6,406,173 B1 | 6/2002 | Serizawa et al. | |
| 6,541,800 B2 | 4/2003 | Barnett et al. | |
| 6,580,228 B1 | 6/2003 | Chen et al. | |
| 6,582,100 B1 * | 6/2003 | Hochstein et al. | ........... 362/294 |
| 6,660,935 B2 * | 12/2003 | Southard et al. | ........... 362/640 |
| 6,722,905 B2 | 4/2004 | Negishi et al. | |
| 6,762,562 B2 | 7/2004 | Leong | |
| 6,886,963 B2 | 5/2005 | Lodhie | |
| 6,911,731 B2 | 6/2005 | Wu | |
| 2002/0061676 A1 | 5/2002 | Kameyama et al. | |
| 2004/0141337 A1 | 7/2004 | Kaga et al. | |

OTHER PUBLICATIONS http://www.ecse.rpi.edu/schubert/Light-Emitting-Diodes-dot-org.
http://www.lrc.rpi.edu/.
http://www.lumileds.com/gallery/?filter=luminaires.
http://lighting.sandia.gov/Xlightingnewsheadline.htm#archives.
http://www.ledsmagazine.com/.

* cited by examiner

*Primary Examiner*—Sandra L O'Shea
*Assistant Examiner*—William J Carter

(57) ABSTRACT

A method and system for attaching LEDs to circuitry which would protect the LEDs from heat damage and allows for individual LEDs to be removed.

21 Claims, 16 Drawing Sheets

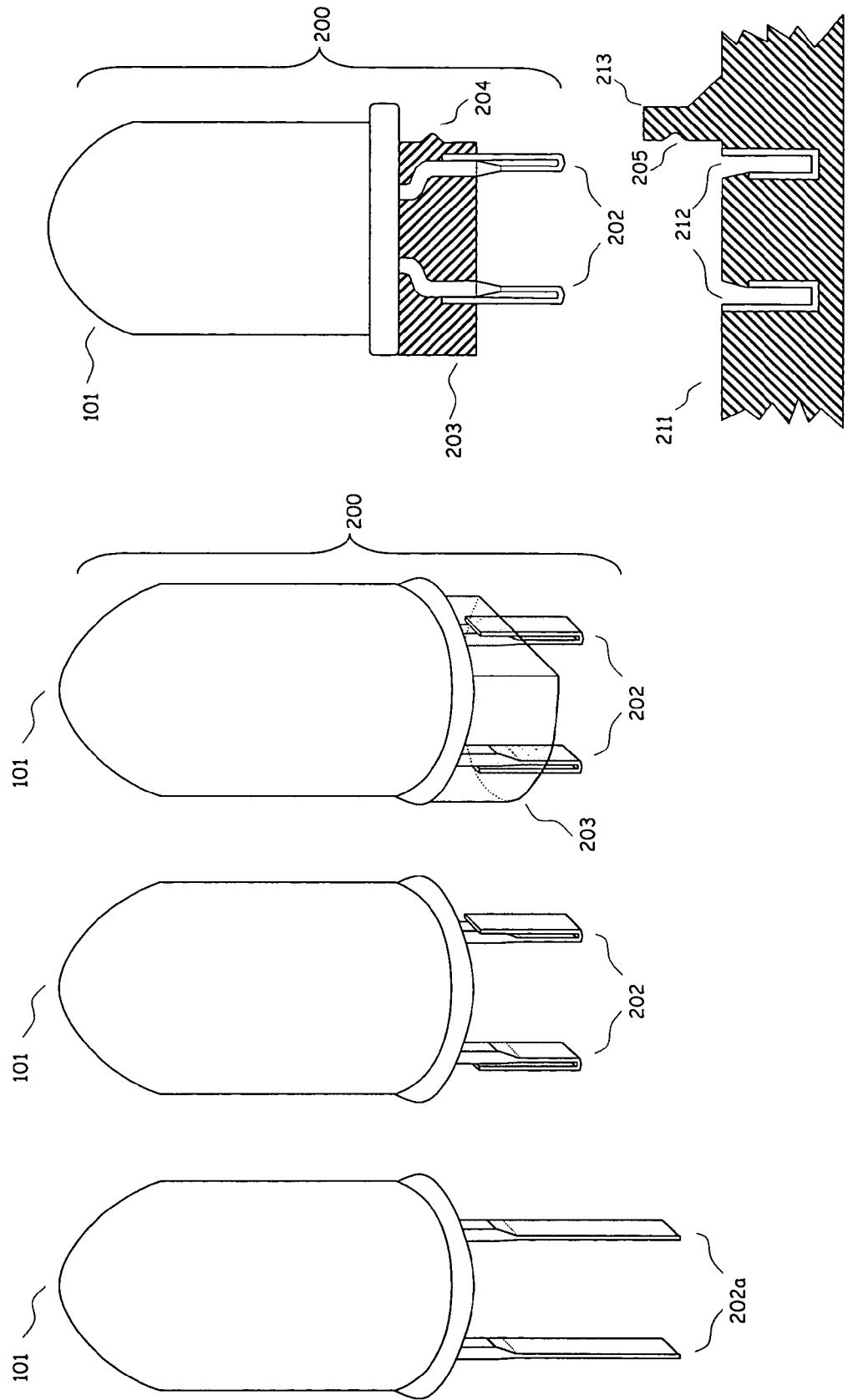

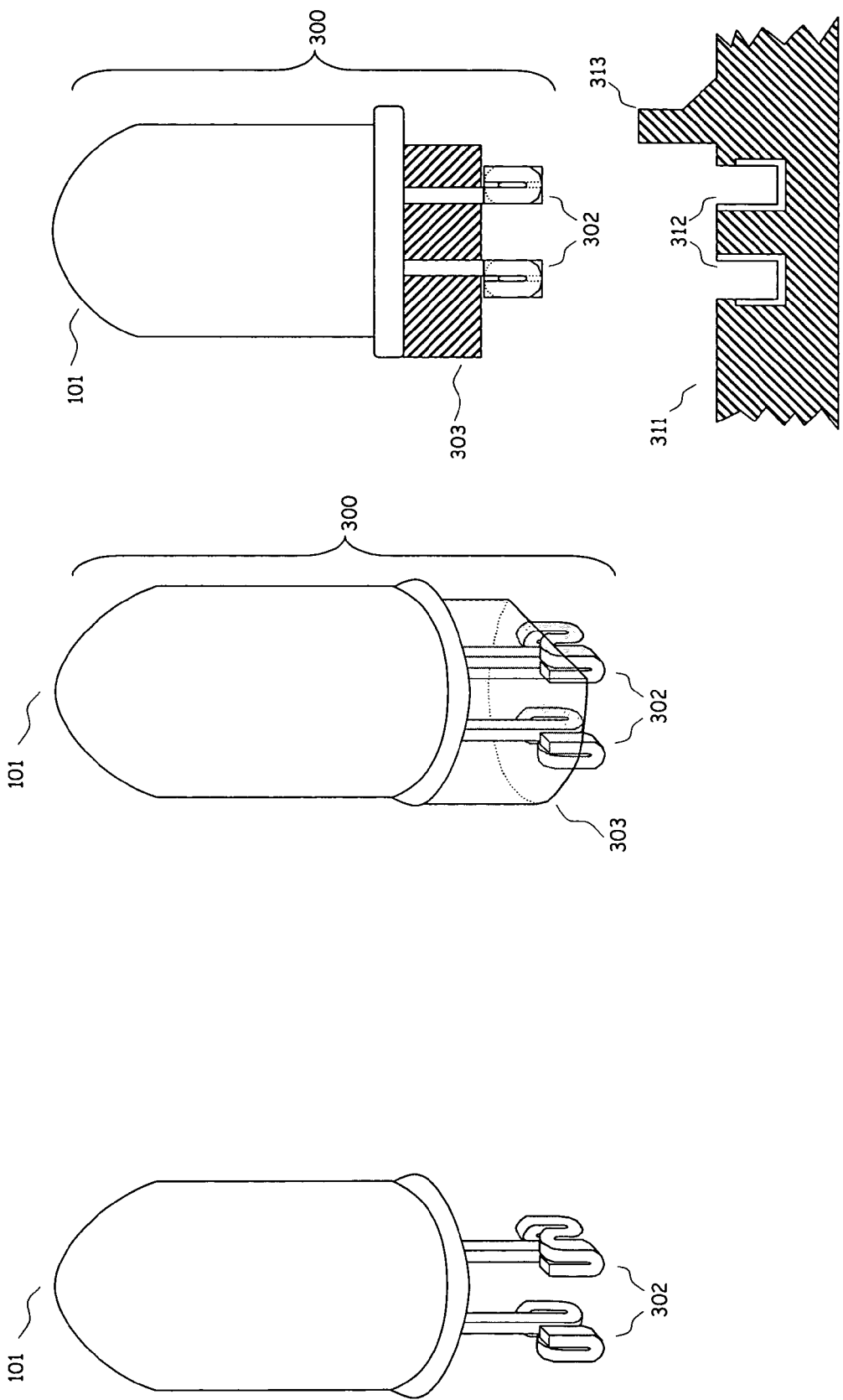

METHOD AND SYSTEM FOR ATTACHMENT OF LIGHT EMITTING DIODES TO CIRCUITRY FOR USE IN LIGHTING

CROSS-REFERENCE TO RELATED APPLICATIONS

This is a continuation-in-part of application Ser. No. 10/969,686 filed Oct. 20, 2004.

STATEMENT REGARDING FEDERALLY SPONSORED RESEARCH OR DEVELOPMENT

Not applicable

REFERENCE TO A MICROFICHE APPENDIX

Not applicable

BACKGROUND OF INVENTION

In the past LEDs were mainly used as status indicator lights in electronics, but with the vast improvements in technology—increasing the efficiency and the lifespan while reducing cost—LEDs have been put to many more uses. Multiple LEDs can easily be assembled together into an array, by soldering the LEDs together into a circuit, which can then be use to replace fluorescent lights and incandescent light bulbs, as respectively shown by U.S. Pat. No. 6,762,562 "Tubular housing with light emitting diodes" and U.S. Pat. No. 6,580,228 "Flexible substrate mounted solid-state light sources for use in line current lamp sockets". LED arrays can be put to multitude of lighting uses given the major advantage of the long life span of LEDs and the minimal shift in color temperature thru the life of the LEDs. The LEDs currently available usually have a lifespan of 50,000 hours and some with a lifespan well over 100,000 hours.

There is little doubt that the lifespan and efficacy of LEDs will only increase as the technology improves. Unfortunately there is no guarantee that every LED is manufactured flawlessly and assembled without damage into a circuit such as the light array. LEDs may fail prematurely largely due to damage caused during the soldering process used to attach most LEDs to circuitry, because of the LED being sensitive to the heat needed to liquefy the solder. A solution to prevent the heat damage would be to use a mechanical process to attach the LEDs such as clamping the leads to the circuitry. However this clamping method of attachment will make production of these LED arrays more complex due to clamping forces required, the small size of the LEDs and tight packing of the LEDs needed to achieve a sufficient light output by the array. Some mechanical methods are taught in U.S. Pat. No. 5,404,282 "Multiple Light Emitting Diode Module" but the spacing between the adjacent LEDs is fairly large due to the clearance needed for the mechanical methods of attachment. The tight packing needed to produce a high light output will not be possible with the mechanical methods. Also the LEDs are permanently attached to its circuitry. This need for a high density of LEDs in combination with the shape of the array can even make soldering a difficult process as seen in the methods utilized in U.S. Pat. Nos. 6,762,562 and 6,580,228 Both patents teach of soldering LEDs onto a flexible flat circuit board/substrate and then bending the circuit board/substrate with the attached LEDs into its final desired shape. The need for the flexible circuit board/substrate is due to the tight spacing of the final shape, making it impossible to solder the LEDs on to a circuit already in the final shape. Unfortunately the flexible circuit board/substrate would be very fragile due to thinness of the circuit board needed to achieve the flexibility. The handling and process of bending the array into the final shape can easily break the electrical circuit, solder joins or LEDs given the thin circuit board/substrate and the heavier bulk of the attached LEDs and solder. The thinness of the electrical circuit would also have a higher resistance hence heating up and along with the heat generated by the LEDs can cause the electrical circuit attached to the bent substrate to expand at different rates, hence pulling it apart. This heating cause by the circuit and LEDs through normal usage and cooling when the array is off can greatly reduce the life of the light array, warping the shape and stressing the circuitry. The flexible circuit board/substrate may also delaminate and crack due to the characteristic differences of the materials and the constant stress caused by the bending. Also the risk of heat damage to LEDs during the soldering process is still not eliminated. U.S. Pat. No. 6,406,173 "Vehicle lamp having light-emitting elements with connecting structure" teaches of a solderless attachment method, whereby a LED with bifurcated lead terminals is used to cut into and mechanically fasten to a thin cylindrical wire. U.S. Pat. No. 6,406,173 avoids soldering, but substantially decreases electrical contact due to the fact that the bifurcated lead terminals must be relatively thin and have a sufficiently sharp edge to cut into the wire and that the contact area between the terminal and wire is limited to where the thin straight edges of lead terminal are tangent to the small diameter wire. Also the LED of U.S. Pat. No. 6,406,173 is not design to be removable. The LED assembly process currently known in the art is very limiting in what can be constructed and the arrays that can be constructed may not be very sturdy.

Yet another problem is when a single LED does fail in a light array—due to heat damage during assembly or production flaw in the LED package—there is currently no easy way to replace just that single defective LED. This usually meant putting up with having one or more blacked out spots in the light array until there are enough individual LED failures to warrant replacing the entire array. This problem with the LED array is neither pleasing to look at, nor very cost effective given the remaining unused lifespan of the still functional LEDs within the array that must be discarded if the array is to be replaced. These reasons and the difficulty of manufacturing the arrays has hampered the wide spread use of LED array based lighting by consumers. Hence a need has been recognized for a method to simplify and improve the process of attaching LEDs to circuitry and allows for easy replacement of faulty LEDs, or other small high efficiency lights, such as OLEDs, PLEDs, etc which hence fore will be referred to as a LED. One can try simply plugging the LED leads in to a breadboard type circuit but the leads need to be sufficiently long to ensure good contact for electrical and thermal conduction. Unfortunately long LED leads are easily bent and will be difficult to insert into the breadboard. The breadboard itself is also costly to manufacture due to the complex circuitry and contacts, and is of limited life as the insertion and removal can wear and loosen the contacts in the breadboard. Hence to ensure a good electrical contact and good heat dissipation the LEDs leads are currently still mostly solder or mechanically clamped permanently to its power circuitry due the small surface area of the leads and difficultly of maintaining a good contact between the lead and the circuit. Another solution currently being used is to assemble a couple of LEDs which maybe of several colors in to a single smaller module, which is then assembled into larger arrays. The modules are replaceable, but not the individual LEDs within the modules. Unfortunately these units are relatively costly to manufacture, cannot achieve the same density of LEDs as with the array of individual LEDs and are still susceptible to the damage cause during assembly of the LEDs into the module circuit. Also the discarding of perfectly functional LEDs within a flawed module when being replace is still not avoided, wasting perfectly usable LEDs. A better solution for attachment and connection of LEDs to circuits, which would enable replacement of individual broken LEDs, while minimizing cost is still needed.

BRIEF SUMMARY OF THE INVENTION

I propose utilizing the LED leads themselves to create a pair of prongs with a spring-mechanism allowing for easy attachment and removal of the LED from circuitry and a method to increase the contact area of these prongs. The invention involves modifying the leads of the LED itself such as bending and folding or flattening and folding the leads. Hence increasing the usability of the LEDs by making them easier to attach to circuitry while minimizing the increase in manufacturing cost. The current LED-manufacturing process would remain unchanged unlike that of U.S. Pat. No. 6,541,800, which also teaches of a method of heatless attachment. The method shown in U.S. Pat. No. 6,541,800 utilizes a "RCA-type plug" that involves a whole new manufacturing process, which would involve major retooling of current manufacturing lines and render useless current manufacturing capacities. The primary embodiment of the present invention would involve simple subsequent modification of the leads of the LEDs to create a pair of prongs with a spring mechanism and then adding some type of encasement to better secure the contact prongs from forces caused during insertion and unplugging of the LED to its circuitry. Hence current LED-manufacturing capacities can still be utilized.

A benefit of the present invention is that the LED array circuitry can be kept very simple involving one or more pairs of parallel electrical and thermal conductive channels, which may hold multiple LEDs. Whereas the circuitry of U.S. Pat. No. 6,541,800 would be more complex due to the "RCA-type plug", where the anode surrounds the cathode making a flat single layer circuit layout impossible, since the electrical paths will have to overlap to make a connection with the cathode that's encircled by the anode.

Besides the benefits described above, several objects and advantages of the present invention are specifically:

Low cost modification without the need to change existing manufacturing processes, since no new parts are introduced, so existing production facilities can be used.

This method of attachment to circuitry eliminates the chance of heat damage to the LED that can occur when the LED are soldered.

Reduced cost of replacement since just those non-functional LEDs are replaced instead of an entire array of LEDs.

A very flexible design of this invention allows the user to easily alter the lighting array color by swapping in different color LEDs without the need of any specialized tools.

The invention would also allow consumers to configure the LED lighting array as illuminated signs by removing and rearranging the LEDs to create an image.

LEDs have been around for decades but haven't really taken off in the consumer market. The present invention will hopefully help expand the use of LEDs to replace other lighting. LED save energy compared with incandescent and protect the environment compared with fluorescent, which contain mercury. Further objects and advantage of my invention will become apparent from a consideration of the diagrams and ensuing description.

BRIEF DESCRIPTION OF THE SEVERAL VIEWS OF THE DRAWING

FIGS. 2a, 2b, and 2c shows isometric views of some stages involved in manufacturing the LED of the first embodiment.

FIG. 2d shows a cross section of the LED and its base socket in the first embodiment and how the LED attaches to its socket.

FIGS. 3a and 3b shows isometric views of some stages involved in manufacturing the LED of the second embodiment.

FIG. 3c shows a cross section of the LED and its base socket in the second embodiment and how the LED attaches to its socket.

DETAILED DESCRIPTION OF THE INVENTION

Figure 1:
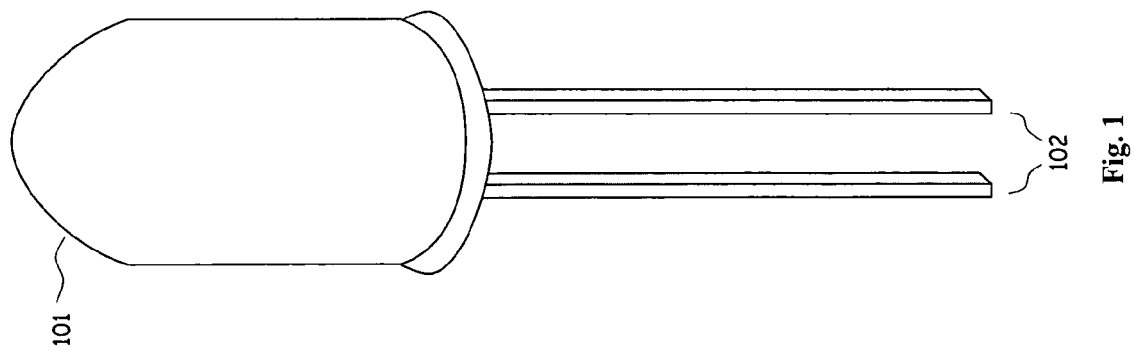
FIG. 1 shows an isometric view of a LED before modification.

A common LED is shown in FIG. 1 before any modification with a pair of leads both an anode terminal and a cathode terminal denoted by 102 and a LED package denoted by 101. In the preferred embodiment the LED 101 has both its leads 102 flattened to increase its surface area as shown by FIG. 2a both the flattened anode and cathode leads are denoted by 202a. The leads are then folded as denoted by 202 in FIG. 2b to form a pair of spring prongs. The folds in prongs 202 allows for some give or compression that helps ensure sufficient contact with a corresponding socket without having to manufacture the prongs nor its corresponding socket to very tight tolerances hence minimizing the cost of manufacturing and assembly. The pair of prongs 202 can then be further secured by adding some type of encasement denoted by 203 right below the base as in FIG. 2c the entire finished LED is denoted by 200. The encasement 203 can be mold on using plastic, resin, or other materials or pre-made in halves and snapped or glued into placed. A notch can be molded into encasement 203, as better shown in FIG. 2d a cross section of encasement 203. The notch in 203 can be used to distinguish the polarity. Still referring to FIG. 2d it can be seen that the pair of prongs 202 has also been bent outward to increase the space between the two prongs. Also shown in FIG. 2d is a portion of the corresponding base socket denoted by 211 that can be form from plastic or a ceramic that provides better thermal conduction while electrically insulating. The pair of electrically conductive u-channels denoted by 212 forms the sockets, which the pair of spring prongs 202 plugs into. The pair of u-channels 212 can be static given that the pair of spring prongs 202 will compress to fit into the u-channels 212, so that the fit of one LED 200 will not affect the fit of an adjacent LED 200 even if the LEDs 200 or base socket 211 are not manufactured perfectly to precise tolerances. If a spring or clamping mechanism for LED attachments were put into the base socket in place of the pair of spring prongs 202, a much more complex and expensive base socket 211 would be needed to achieve the same fit tolerances as the LED of the present invention. A polarity alignment tab as denoted by 213 in FIG. 2d matches up with the notch in encasement 203 to ensure that the LED prongs 202 can only be plugged in to the base socket 211 one way. Further more a locking mechanism can be implemented through the addition of a ridge denoted by 204 in FIG. 2d that fits into groove denoted by 205 when the LED 200 is mated with the base socket 211. Hence the LED 200 will simply snap securely into place when plugged into the base socket 211 making the assembly process very easy.

An alternative embodiment would not involve flattening the leads but requires multiple bends in order to increase the contact surface area as shown in FIG. 3a. The leads have multiple folds to create a pair of spring prongs denoted by 302. The prongs 302 are folded in such a manner to increase the surface area in the contact planes while reducing the length of the prongs to an optimal size, so that the prongs won't be easily damaged—such as accidentally being bent—when being inserted or removed. This embodiment also uses an encasement denoted by 303 in FIG. 3b and FIG. 3c. Encasement 303 serves the same function as encasement 203 in the previous embodiment to make the pair of spring prongs 302 sturdier. The whole LED is denoted by 300. FIG. 3c shows the cross section of this embodiment and a portion of its corresponding base socket 311, which contains a pair of conductive u-channels denoted by 312 that fits with the pair of spring prongs 302 and a polarity alignment tab denoted by 313 that matches up with the notch in encasement 303. An alternative to the notch in encasement 303 and polarity alignment tab 313 the anode prong and cathode prong themselves can also be made to different thicknesses along with their corresponding sockets, so that it is easy to distinguish between the anode and cathode, although not drawn it is easily understood by anyone skilled in the art.

Figure 4C:
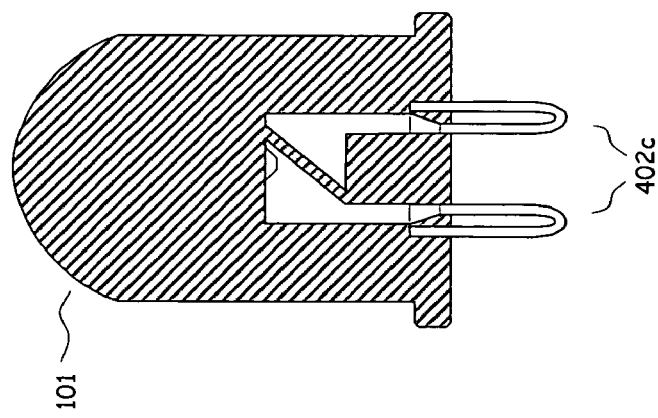
FIG. 4c shows a cross section of an alternative embodiment with LED's leads modified before manufacture.
Figure 4B:
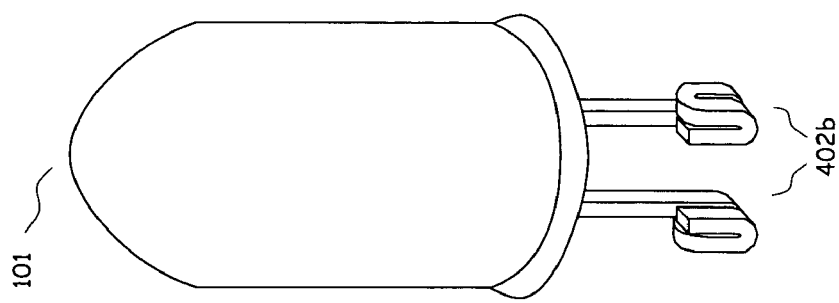
FIGS. 4a and 4b shows isometric views of some alternative embodiments.
Figure 4A:
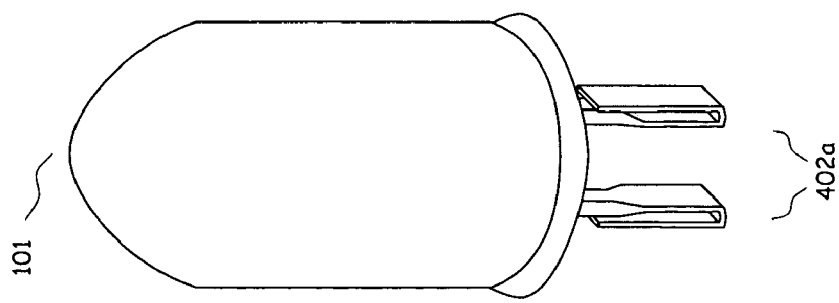

Some other embodiments are shown in FIG. 4a, FIG. 4b, and FIG. 4c. The pair of spring prongs denoted by 402a of FIG. 4a are similar to the pair of prongs 202 of the first embodiment, but has only the outer sides of the leads flatten in so that the inner surface of the two prongs 402a are flush, whereas prongs 202 in the first embodiment has uneven inner surfaces. The pair of spring prongs denoted by 402b in FIG. 4b are similar to the prongs 302 of the second embodiment but has fewer bends, which makes the fabrication simpler therefore reducing the cost of manufacturing. Both 402a and 402b can also be secured further by encasing the prongs partially in the same way as 203 and 303 in the first and second embodiments. FIG. 4c shows a cross section of alternative embodiment where the LED leads are modified as denoted by 402c similar to prongs 402a before the production of the LED. The modified leads 402c are used in the manufacture of the LED, where by the LED manufacturing process secures prongs 402c without the need for the additional encasement 203 of the first embodiment. However this would involve the retooling of the LED production line itself, although relatively minor as compared with U.S. Pat. No. 6,541,800, since only the dimension of the lower portion of the leads 102 are modified leaving the rest of the LED the same. The benefit of this is lower long run production cost, but higher initial cost due to retooling. This would be the preferred embodiment if production volume were large enough to justify the retooling. As with most new technology initial volume will be low and gradually increase so a lower starting cost would be desirable as with the post-modification of the first embodiment. However as volume increase to a critical level it would better and cheaper on the long run to modify the lead before manufacture of the LEDs. The leads both the anode and cathode could also be manufactured with thicker material and bent similar to prongs 402c if the retooling route is chosen. The benefit of thicker leads is better heat dissipation, which wasn't possible previously because the attachment process would have damaged the LED die if a thicker lead is soldered, transferring a lot more heat to the LED die.

Figure 5:
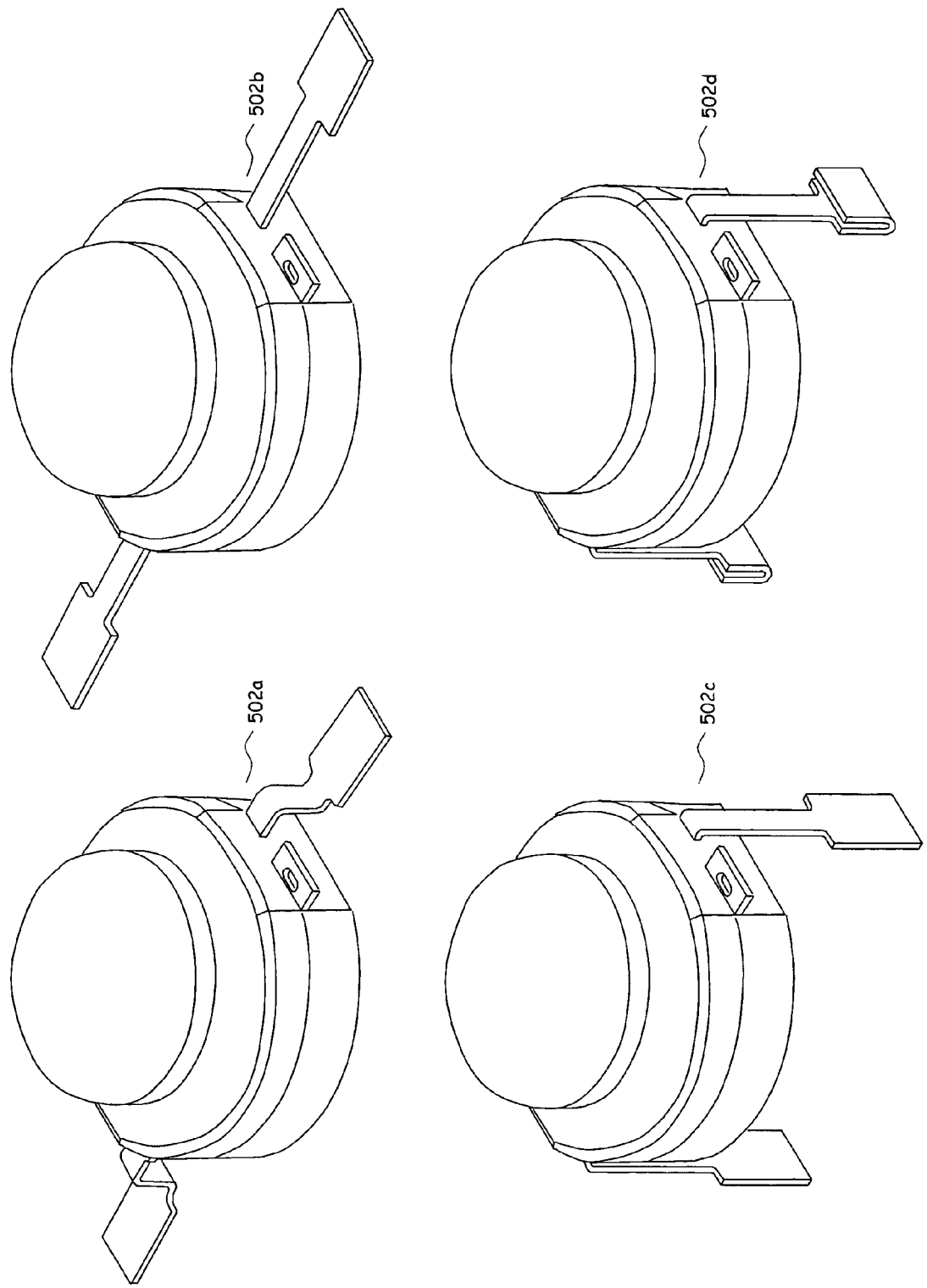
FIG. 5 shows an isometric view of another type of LED package and stages involved in this alternative embodiment.
Figure 5Z:
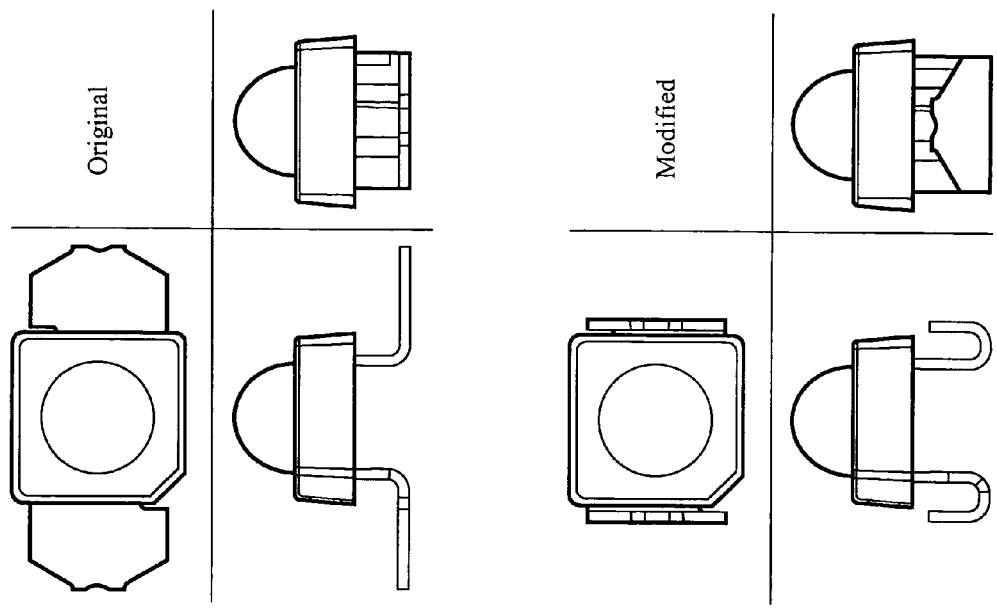
FIG. 5z shows two orthographic views of yet another type of LED package. The top view shows the original LED and the bottom view shows the modified LED according the present invention.
Figure 5Y:
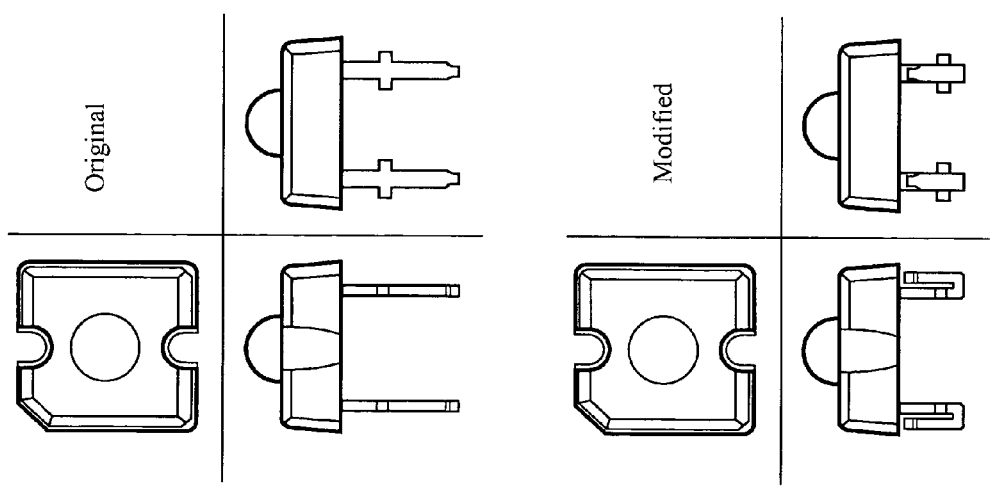
FIG. 5y shows two orthographic views of another type of LED package. The top view shows the original LED and the bottom view shows the modified LED according the present invention.

Other LED packages can also be modified to be used in the same way. FIG. 5 shows some steps in creating spring prongs using a different LED package. The original LED is denoted by 502a. The flattening of the leads as denoted by 502b is done to lengthen the leads so that the leads can then be bent down as denoted by 502c to create a sufficiently long prong. The pair of leads is then folded over to create a spring mechanism forming a pair of spring prongs as denoted by 502d that can be plugged into a socket similar to the preceding embodiments. FIG. 5y shows two orthographic views of another LED package the upper view is the original LED and the lower view shows how the LED has been modified in the practice of the present invention. FIG. 5z shows another two orthographic views of yet another possible LED package to be used in the practice of the present invention the upper view is the original LED and the lower view shows the modified LED. The position at which the leads are folded and the direction—the ends folded towards the center or away from the center—should not be construed as limiting the present invention. Other LED packages can also be modified to be used in the practice of the present invention and the type of LED is not to be limited to only those shown.

Figure 6:
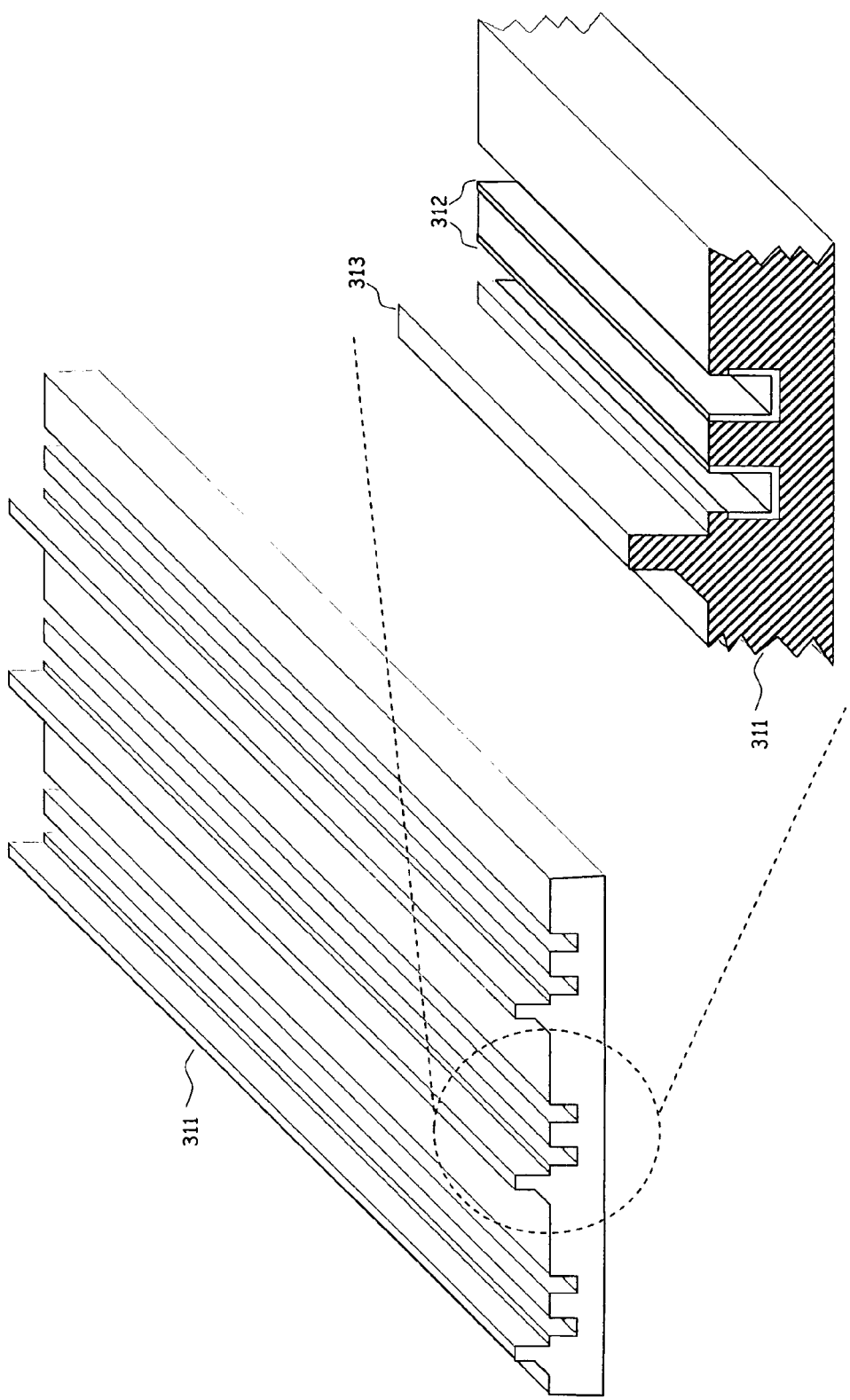
FIG. 6 shows an exploded isometric view of a LED base socket rotated 180 degrees from that of the cross section in FIG. 3c
Figure 7:
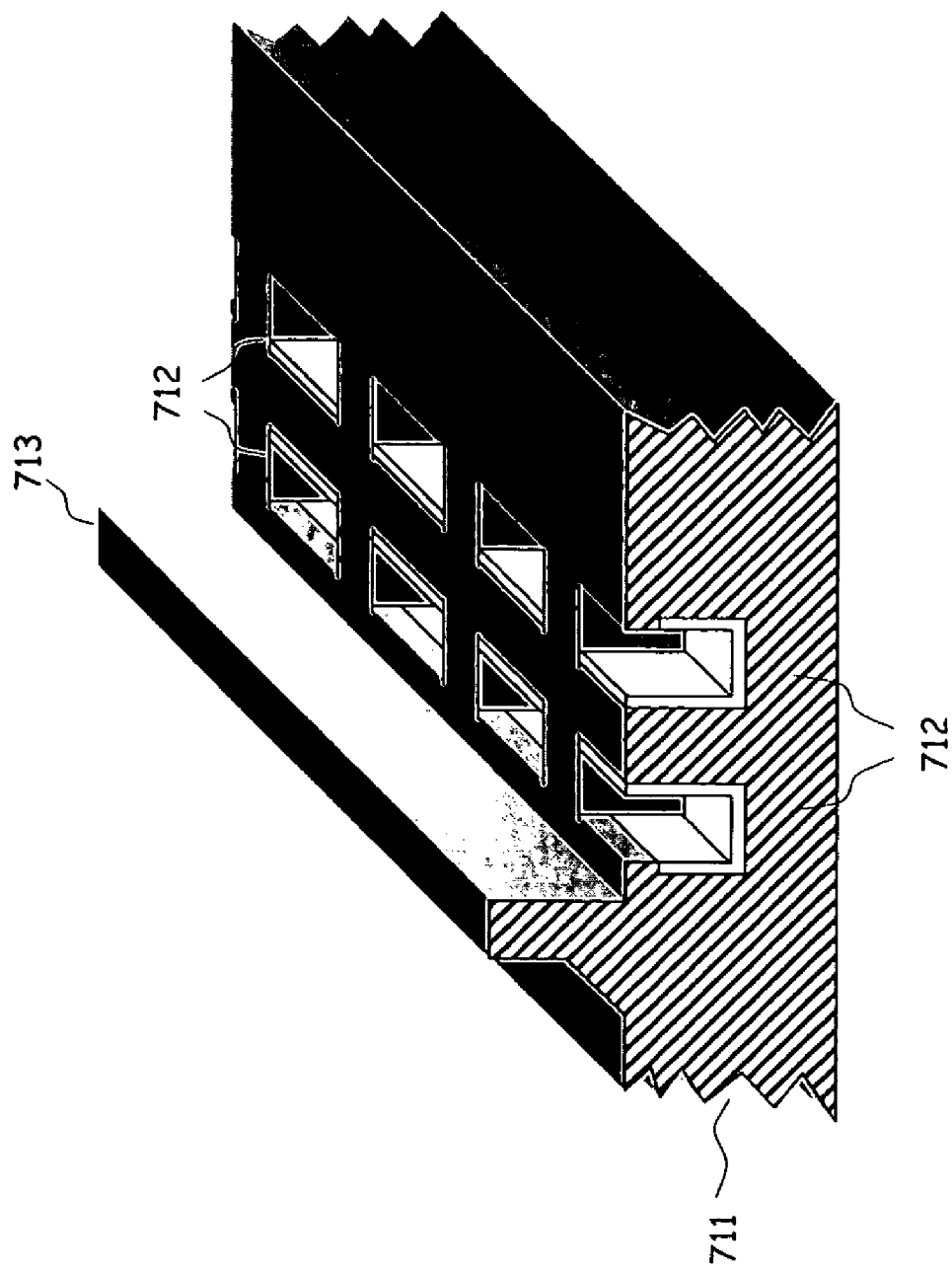
FIG. 7 shows an isometric view of an alternative LED base socket with separated individual contact channels.
Figure 12:
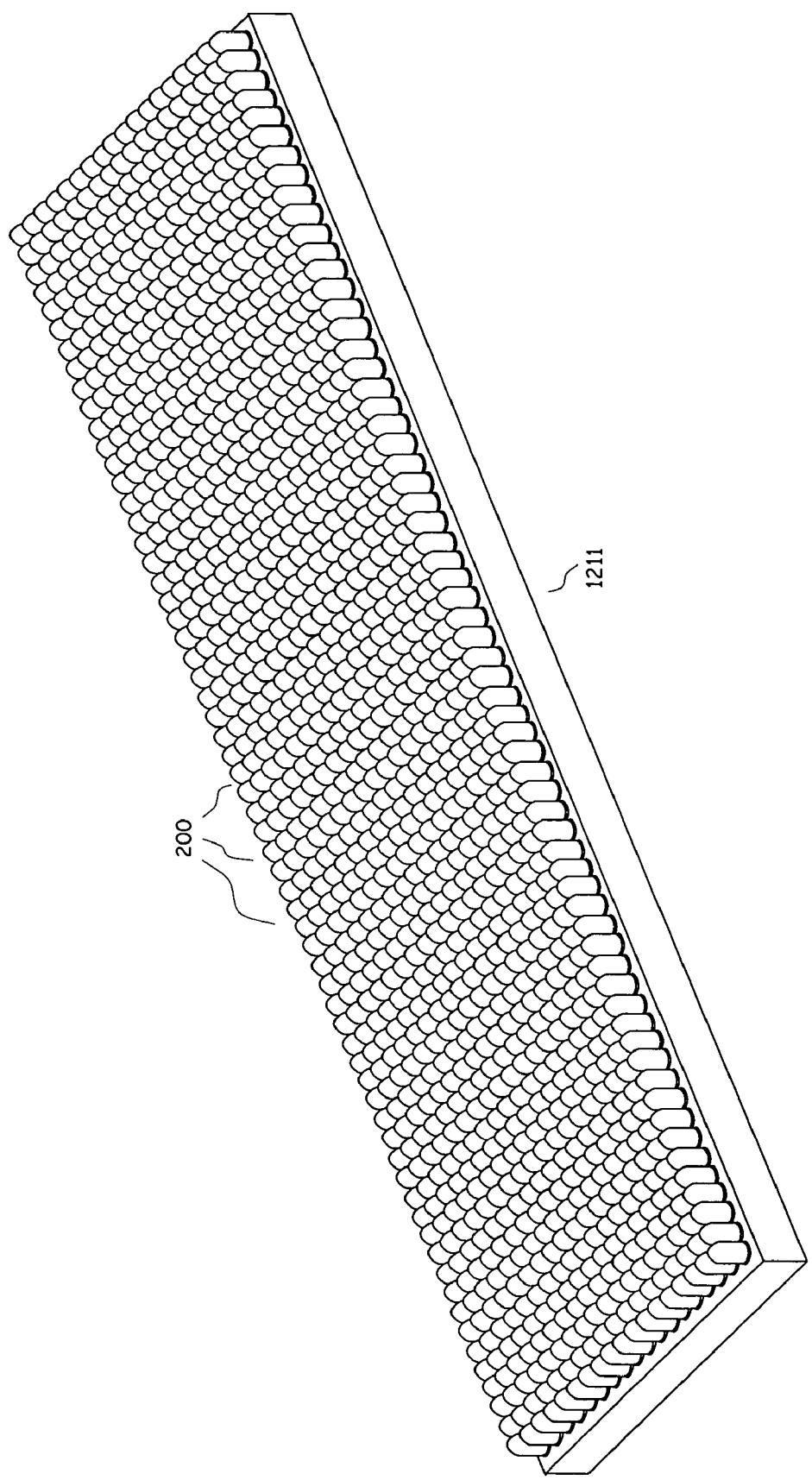
FIG. 12 shows a light array utilizing LEDs.

An exploded isometric view is shown in FIG. 6 of a portion of the base socket 311 and the pair of electrically conductive u-channels 312 one positive and the other negative into which prongs 302 are inserted. Multiple LEDs can be installed in the pair of u-channels 312 and multiple pairs of u-channels 312 can be used utilized to form the entire base socket. A base socket 1211 with multiple pairs of u-channels and multiple LEDs 200 installed in those u-channels is shown fully assembled in FIG. 12. Shown in FIG. 7 is a base socket 711 with a polarity alignment tab denoted by 713 and separated individually addressable u-channels/socket pairs denoted by 712. The base sockets 311 shown above has parallel channels able to hold multiple LEDs in parallel to keep the base circuitry simple, but the LED of the invention can also be used with an array base sockets where each socket pair holds a single LED or group of LEDs where each socket pair is individually addressable like that of socket pairs 712. The individualized socket pairs 712 would allow for individual LEDs to be turn on or off independent of the other LEDs in the array.

Figure 8:
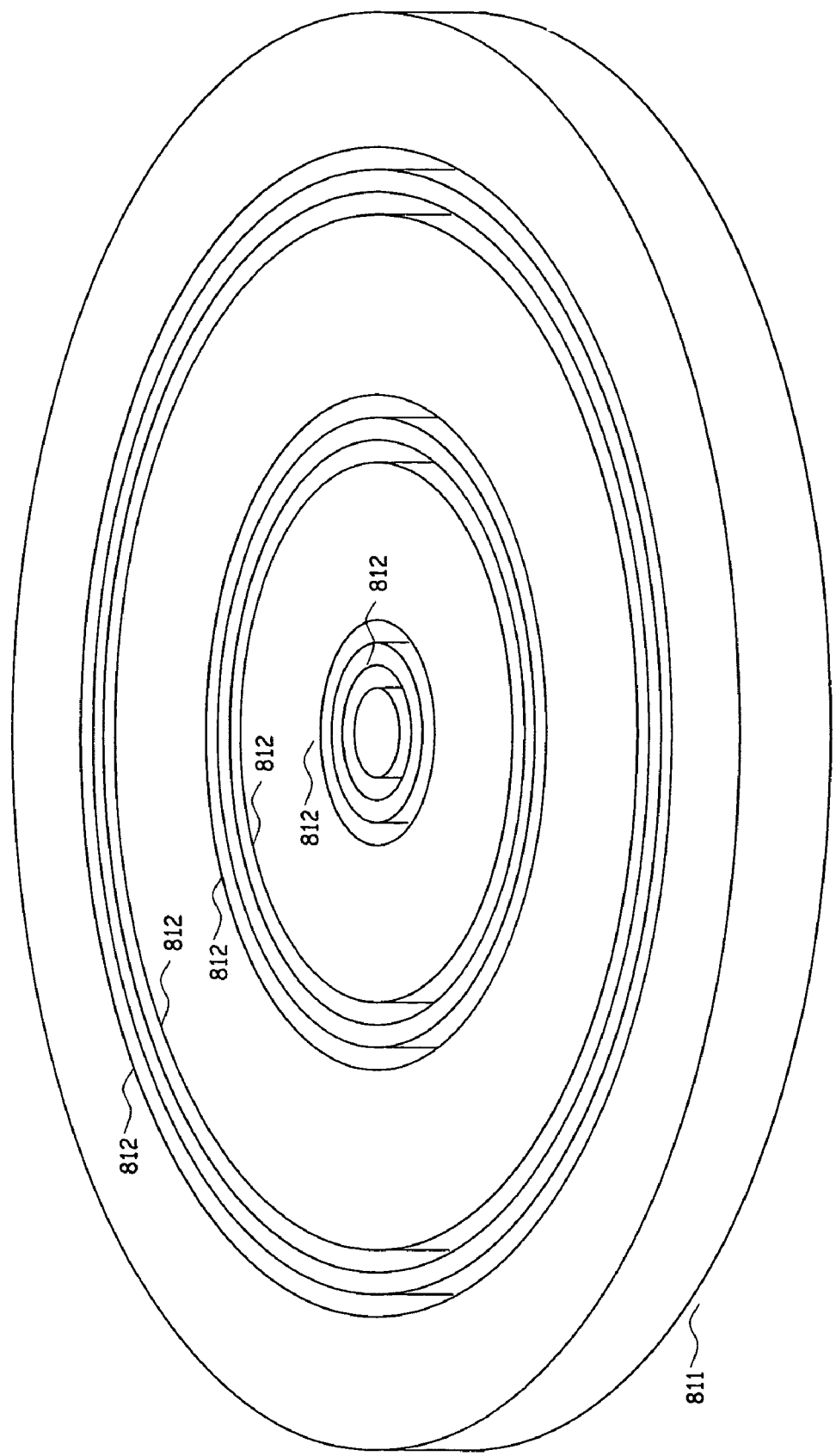
FIG. 8 shows an isometric view of an alternative LED base socket shape and layout.
Figure 9:
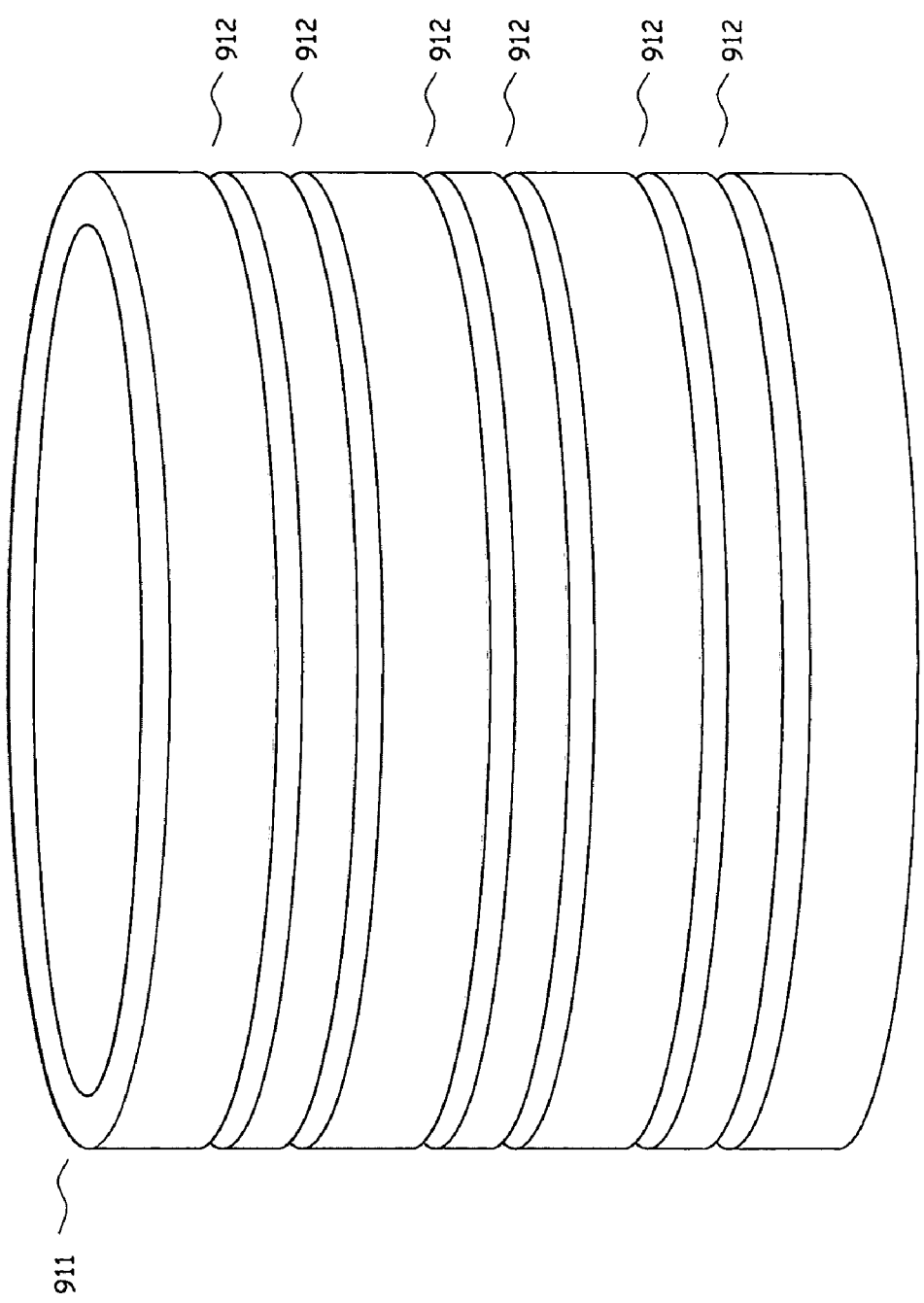
FIG. 9 shows an isometric view of another alternative LED socket shape and layout.
Figure 9A:
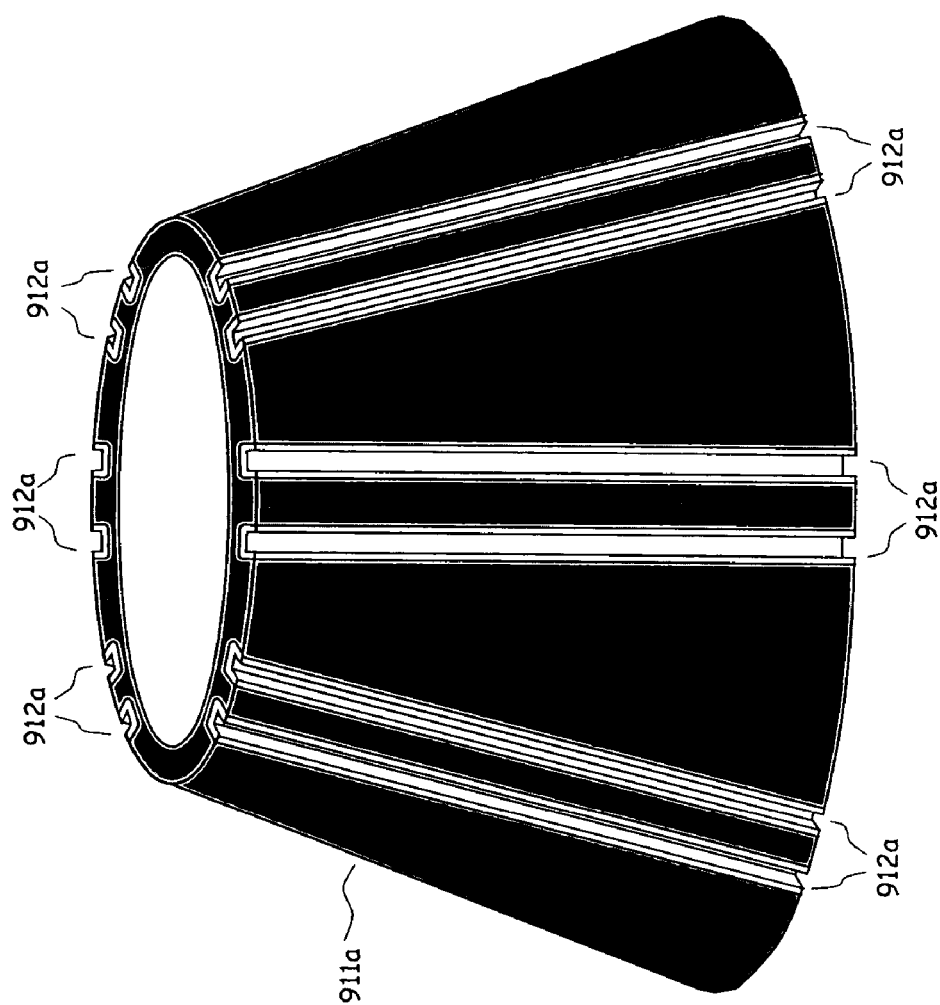
FIG. 9a shows an isometric view of another alternative LED socket shape and layout.

A full circular base socket denoted by 811 is shown in FIG. 8 without the polarity alignment tab. The base socket 811 has three pairs of electrical u-channels or tracks denoted by 812 laid out concentrically. The voltage and amps used by this base socket 811 can be manipulated by how the three pairs of u-channels 812 are wired—in parallel or series—and by the LED voltage and current requirements. The u-channels 812 can be laid out more tightly than illustrated in the base socket 811, and the electrical circuitry is kept very simple in the base socket 811 due to the attachment mechanism being in the prongs of the LED instead of the base circuitry. Yet another base socket is shown in FIG. 9 this base socket denoted by 911 is a cylinder with three pairs of electrical u-channels/tracks denoted by 912 going around the cylinder. The u-channels 912 can also be laid out closer than illustrated and the cylinder of any diameter or length. A cone shaped base socket denoted by 911a is shown in FIG. 9a the base socket is a section of a cone with six pairs of electrical u-channels/tracks denoted by 912a running from the outer rim towards the smaller center rim around the outer surface of the cone. More complex base sockets can be easily created by combining the above described base sockets and the base socket can be created in any shape and size and wired in many ways not to be limited to the ones shown.

The present invention would greatly simplify the construction of LED arrays of any shape and size not to be limited to those described above. For example the base circuit socket 911, which will hold an array of LEDs, can be easily constructed. A mold of the desired shape will be needed in this case a hollow cylinder. The electrically conductive u-channel 912 will be shaped accordingly (rings) and laid out within the mold and wired into a circuit. The mold will be then injected with plastic or some other electrically insulating material, which will solidify and give structure to the circuitry laid out within the mold. Then the LEDs of this invention would be simply inserted into the finished base circuit socket thus minimizing the assembly operation and handling and hence the chances for damage of the LEDs during the manufacturing process. It would also be possible to have the desired shape machine milled or molded alone with paths for the u-channels and circuitry that will be added afterwards to the finished shape, but this method would be more labor intensive requiring that the electrically conductive u-channel be fitted into the corresponding milled/molded trough and the wired together to form a circuit. The base socket if machine milled can be made of any material, such as synthetics, glass and even metal, but with metal proper electrical insulation must be applied between the electrical u-channel and the metal base.

Figures 13A, 13B:
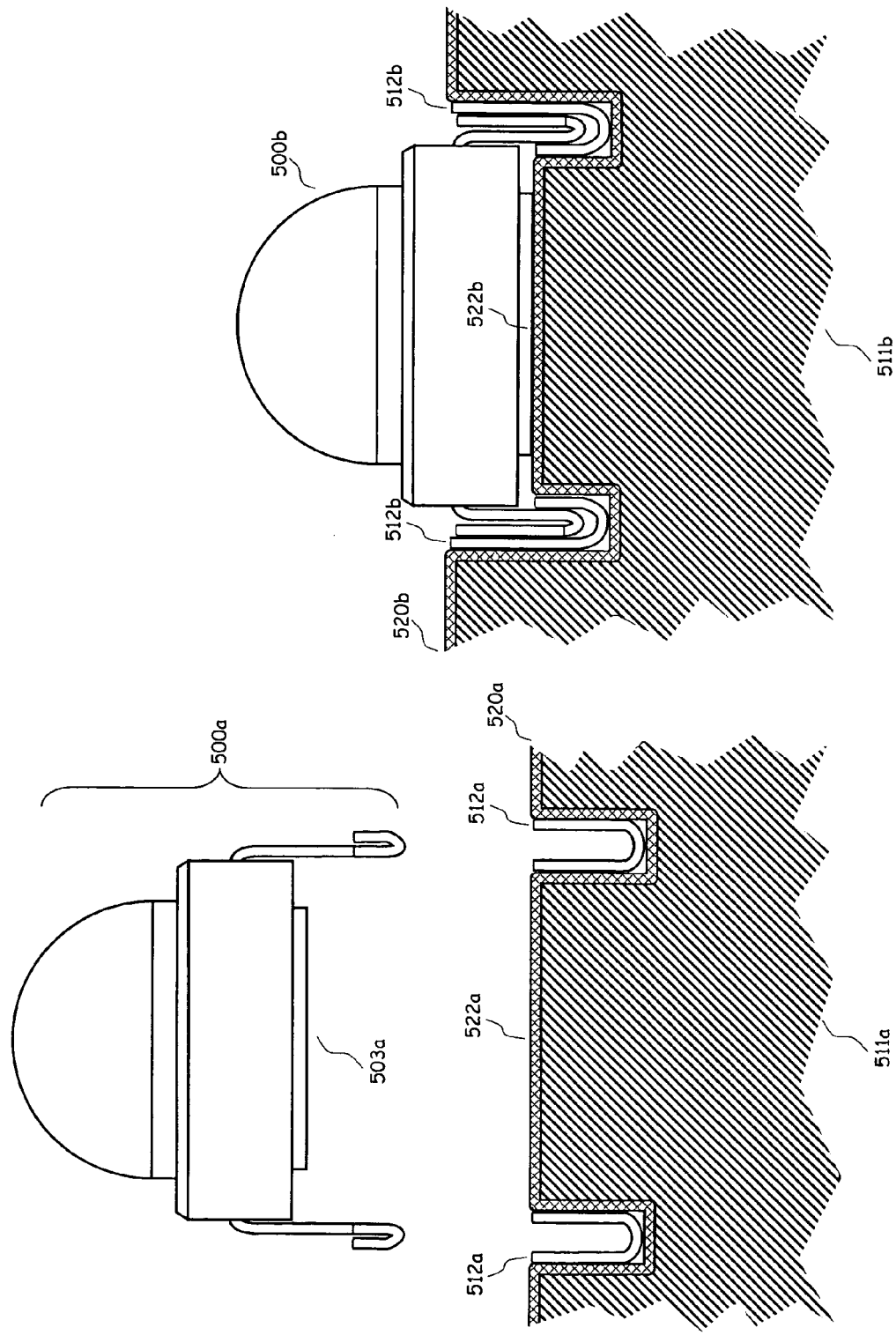
FIG. 13a shows the LED of FIG. 5 and a cross section of its base socket with thermal pad.
FIG. 13b shows a cross section another base socket with thermal pad and a corresponding embodiment of the LED installed.

An additional embodiment of the socket would be made out of aluminum wherein the surface which holds the electrical channels is anodized to form a dielectric layer denoted by 520a in FIG. 13a the electrically conductive u-channels 512a is then laid in the channels of the base 511a preferably utilizing thermal adhesive. The anodized layer 520a provides an electrically neutral surface for the pair of electrically conductive u-channels 512a and also a LED heat sink slug 503a to couple to the surface denoted by 522a between the pair of u-channels 512a of the base socket 511a whereby providing thermal conductivity and heat dissipation. The LED heat sink slug 503a would preferably have thermal grease applied between it and the anodized surface 522a of the socket 511a to provide better thermal contact. Thermal tape or thermal adhesive may also be used in place of the thermal grease, whereby still allowing for removal of the LED without damage to the base socket, although the failed LEDs themselves may be further damaged by the removal process it is not a concern as the failed LEDs will be discarded.

FIG. 13b shows a LED 500b with prongs bent in an alternate manner and installed in its corresponding socket 511b with an anodized layer 520b and a surface 522b for establishing thermal contact with the LED between the pair of electrically conductive u-channels 512b. FIG. 13c show another embodiment wherein the pair of u-channels 512c each has a side wall which is at an angle towards each other, so as to provide a downward force on the LED 500c to improve the contact of LED 500c to the surface 522c of the base socket 511c. It would be possible to created the base socket out of other materials which provide thermal conductivity, wherein the LEDs are coupled to the surface between the pair of electrical channels of the base socket, whereby providing thermal conductivity and heat dissipation. Although not shown in the drawings it is easily understood that the base can be further attached to a heat sink or other cooling device.

Figure 13D:
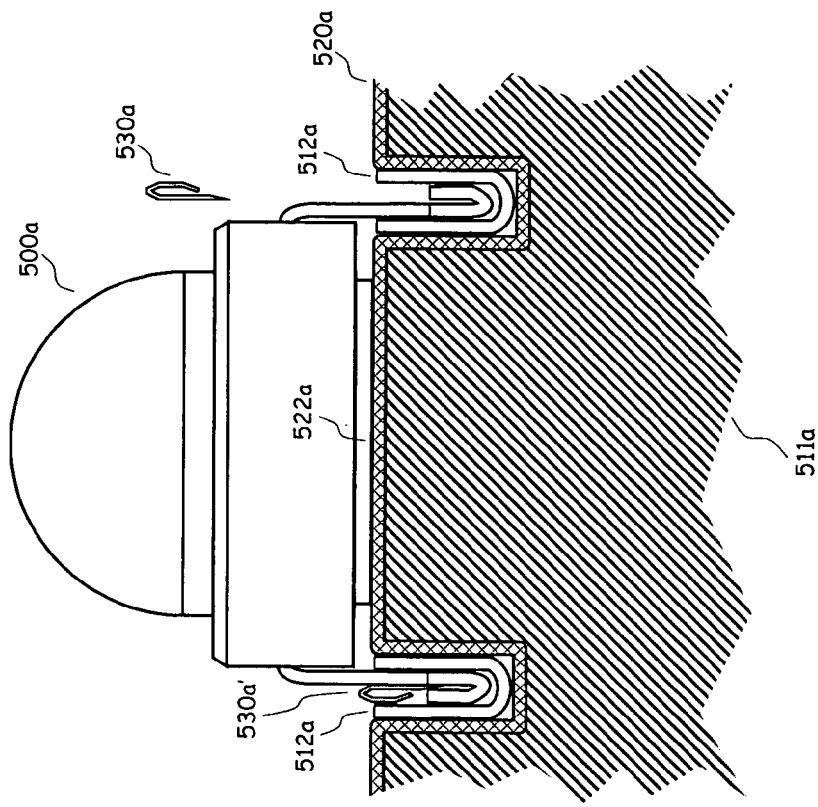
FIG. 13d shows a cross section base socket of FIG. 13a with the LED installed with an addition fastening mechanism.
Figure 13C:
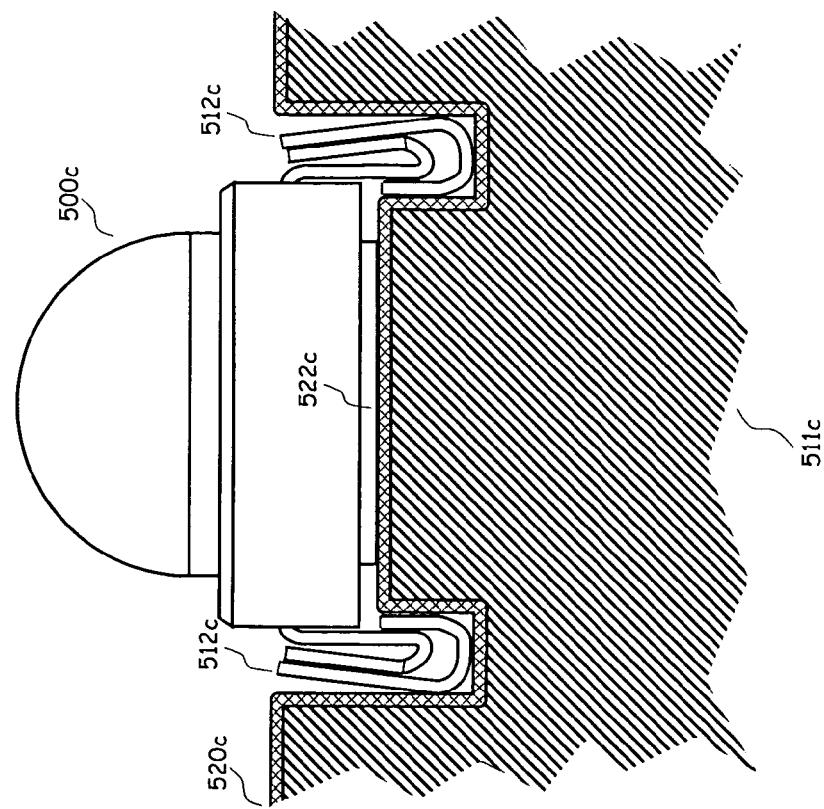
FIG. 13c shows a cross section another base socket with thermal pad and a corresponding embodiment of the LED installed.

FIG. 13d shows an additional fastening mechanism denoted by 530a which is to be inserted in the conductive u-channels 512a as denoted by 530a', to further secure the prong in the channel and increase electrical contact between the prong and channel. The fastening mechanism 530a has a wedge shape formed along one of the edges and may optionally have a spring mechanism that will be compress when inserted in the channel. Preferably the fastening mechanism 530a is constructed of electrically conductive material and can be made to run the length of the conductive u-channels 512a whereby securing multiple LEDs in the u-channels 512a or can be made in shorter sections whereby securing one LED or a smaller group of adjacent LEDs.

Figure 10:
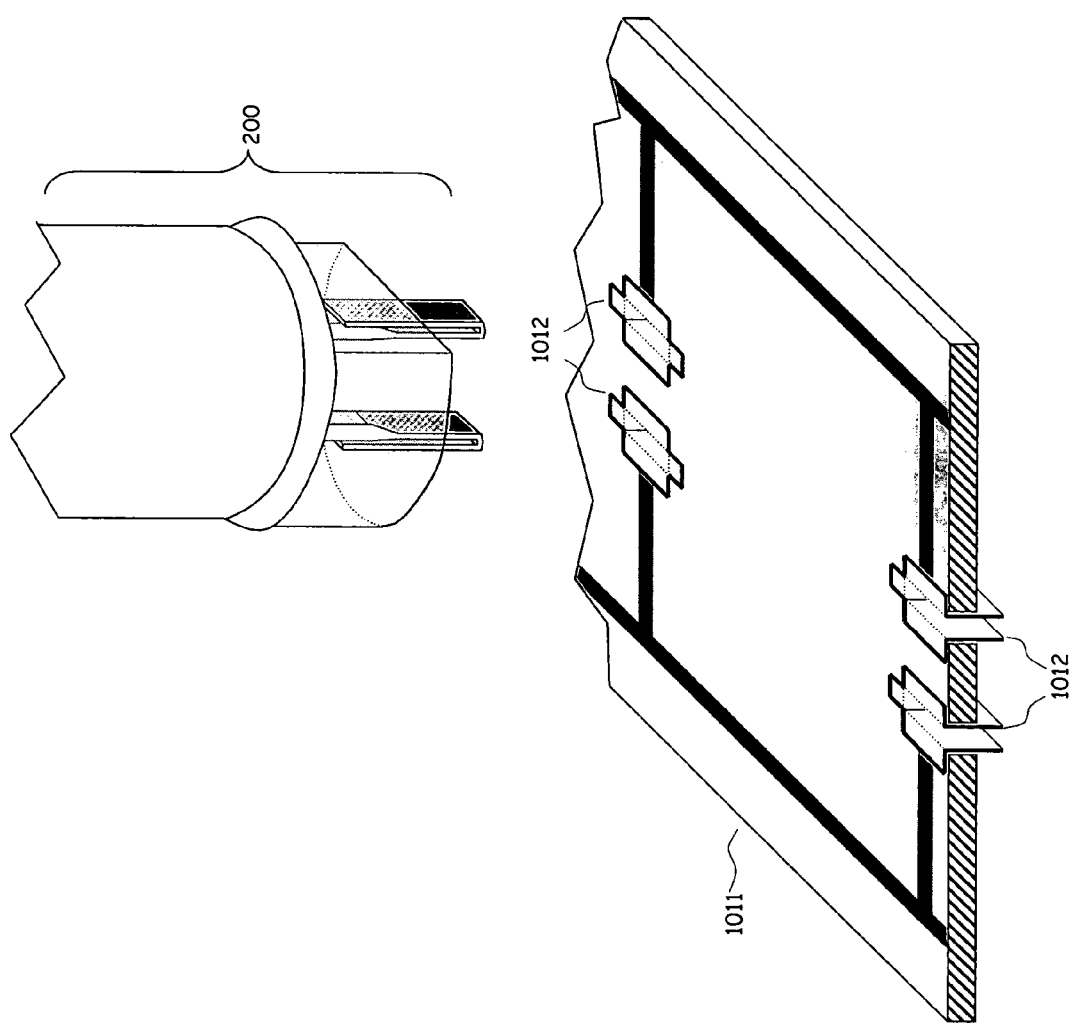
FIG. 10 shows an isometric view of a conventional circuit board modified for attachment of the LED of this invention.

FIG. 10 show of a conventional circuit board denoted by 1011 with pairs of electrically conductive rectangular grommet denoted by 1012 fitted into holes within the circuit board 1011 and solder to the circuitry. The pair of grommets 1012 allows for the LED 200 of the first embodiment to be attached and used with and conventional circuit board, while protecting the LED 200 from damage, since only the grommets 1012 are soldered and exposed to heat.

Figure 11:
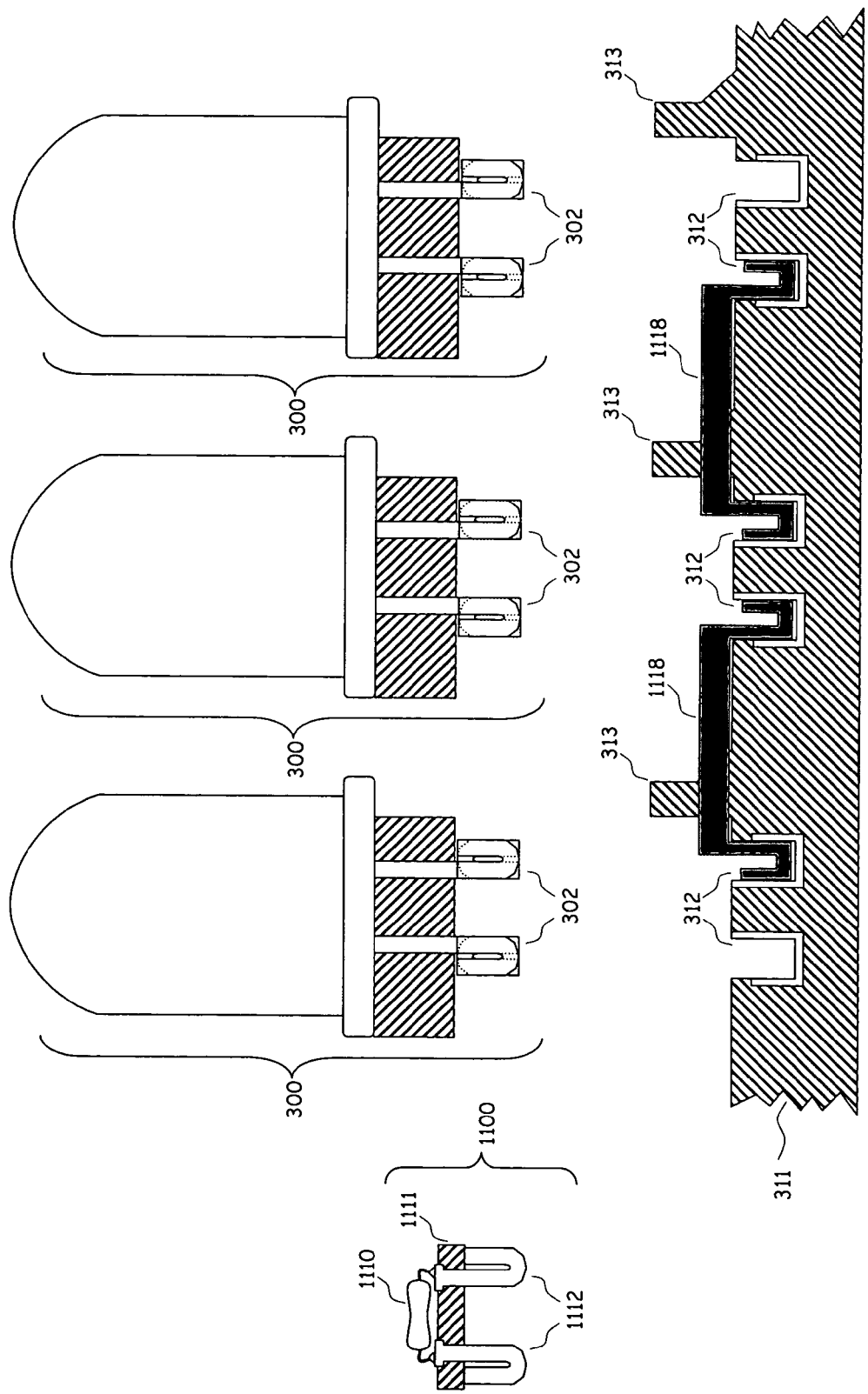
FIG. 11 shows an electrical bridge that can be used to connect portions of the circuit.

The multiple pairs of u-channels 312 in the base socket 311 do not have to be electrically hard wire to each other into a circuit. Electrically conductive jumper/bridges denoted by 1118 in FIG. 11 can be plugged into the u-channels 312 to form complete circuits between multiple pairs of u-channels 312. In FIG. 11 a cross sectional view shows two separate jumpers 1118 connecting the three separate pairs of u-channels 312. When a power source is connected to the left most and right most tracks with the LEDs 300 plugged into the pairs of u-channels 312 a completed circuit is formed with the jumpers 1118. The benefit of this is that the circuit can easily be reconfigured. The jumpers 1118 can be a simple electrical conductor or contain some electrical regulating circuit such as a resistor to adjust for difference in power required between different pairs of u-channels 312. A jumper utilizing a resistor is denoted by 1100, although jumper 1100 is a different size than jumper 1118 they can be constructed with a resistor in the same way. Jumper 1100 contains a pair of electrically conductive spring prongs denoted by 1112 mounted on a non-conductive base denoted by 1111. A resistor denoted by 1110 is soldered to the pair of prongs 1112 connecting the two prongs 1112 electrically. A single jumper 1100 can be used in place of a single LED 300 consuming the same electricity as LED 300 would, so that the array can contain lit and unlit area allowing patterns or images to be displayed while maintaining the electrical levels between multiple pairs of u-channels 312. Thus allowing the consumer to create their own custom illuminated signs by rearranging the LEDs 300 within the base socket 311 and using the jumpers 1118 and resistor modules denoted by 1100 to regulate the electricity. Furthermore a flexible translucent tube sheathing clear or colored can be used to cover sets of LEDs to create lines to produce the effects of a neon signs.

Although only a couple types of LED packages, methods of LED leads modification and array shapes have been described in detail above, it will be understood to those skilled in the art that, the present invention can be used with many different types of LED packages and that, the fabrication of the spring prongs can be done in many other ways too numerous go into detail. The shape of the base socket is also as numerous as whatever one can imagine. Many modifications and substitution not detailed in specification can be made without departing from the spirit and the scope of the invention.

The invention claimed is:

1. An LED array comprising:
  a plurality of packaged LEDs each having a first terminal and a second terminal and a heat sink slug dispose between said first terminal and second terminal; and
  a multiple-LED base socket having an outer surface and a pair of electrically conductive channels formed in the outer surface;
  said pair of electrically conductive channels being adapted to receive the terminals of the plurality of packaged LEDs; and
  said plurality of packaged LEDs being arranged adjacent one another on the outer surface of the base socket with the first terminals of the LEDs being inserted in one of the channels of said pair of electrically conductive channels and the second terminals of the LEDs being inserted in another of the channels of said pair of electrically conductive channels, wherein said first terminal and second terminal both being outwardly biased springs each engaging a sidewall surface comprising an electrically conductive plate, wherein said heat sink slug establishes thermal contact to the outer surface of the base socket between said pair of electrically conductive channels.

2. The array of claim 1 wherein the heat sink slug establishes thermal contact to the outer surface of the base socket between said pair of electrically conductive channels with the aid of a thermal grease, a thermal tape or a thermal adhesive.

3. The array of claim 1 wherein an outer most wall of one channel and an outer most wall of the other channel of said pair of channels are angled inward toward each other.

4. The array of claim 1 wherein comprising an additional pair of trim adapted for insertion into the pair of channels after the installation of the LEDs to further secure the terminals to said pair of channels.

5. The array of claim 1 wherein the outer surface of the base socket is substantially planar and said electrically conductive channels are parallel to one another and run laterally across the upper surface between first and second ends of the base socket.

6. The array of claim 1 wherein the outer surface of the base socket is substantially planar and said electrically conductive channels are formed as substantially concentric rings.

7. The array of claim 1 wherein the outer surface of the base socket is cylindrical in shape and said electrically conductive channels are formed as peripheral rings around the cylindrical outer surface.

8. The array of claim 1 wherein the outer surface of the base socket is conical in shape and said pair of electrically conductive channels are formed in the outer surface running from an outer rim of said conical base socket towards a inner center rim of said conical base socket.

9. The array of claim 1 further comprising at least one additional pair of electrically conductive channels adapted to receive respective first and second terminals of an additional plurality of packaged LEDs.

10. The array of claim 9 wherein one of the channels of one of the pairs of electrically conductive channels is coupled to one of the channels of another of the pairs of electrically conductive channels via a conductive jumper.

11. The array of claim 1 further comprising a jumper inserted in said base socket, said jumper having first and second terminals, with the first terminal of the jumper being inserted in one of the channels of said pair of electrically conductive channels and the second terminal of the jumper being inserted in the other of the channels of said pair of electrically conductive channels.

12. The array of claim 11 further comprising a plurality of said jumpers interspersed with packaged LEDs so as to provide a desired light pattern for said array.

13. The array of claim 1 wherein the first and second terminals of at least one of said packaged LEDs comprise a pair of spring prongs formed from respective leads of said LED.

14. A packaged LED comprising a heat sink slug dispose between a first and second terminals having respective outwardly biased spring leads adapted for insertion into respective first and second conductive channels of a base socket, each of said outwardly biased spring leads engaging a conductive sidewall surface pane of said respective channels to thereby establish electrical contact between the terminals and the base socket and said heat sink slug establishing thermal contact with said base socket between said first and second conductive channels of said base socket, and a plurality of locations being arranged adjacent one another on an outer surface of the base socket for insertion of each of said outwardly biased spring leads.

15. A multiple-LED base socket for an LED array, the base socket having an outer surface and a pair of electrically conductive channels formed in the outer surface, and a thermal contact surface disposed between said pair of electrically conductive channels, with first and second electrically conductive channels of said pair of electrically conductive channels being adapted to receive respective first and second terminals of each of a plurality of packaged LEDs, wherein said first and second terminals being outwardly biased engaging an electrically conductive plate of each of said pair of electrically conductive channels and said thermal contact surface adapted to established thermal communication with a heat sink slug of each of the plurality of packaged LEDs.

16. The base socket of claim 15 wherein said pair of channels has a outer most wall of said first electrically conductive channel and a outer most wall of said second electrically conductive channel that are both angled inward toward each other.

17. The base socket of claim 15 further comprising an additional pair of trim adapted for insertion into the pair of channels after the installation of said packaged LEDs to further secure said first and second terminals to said respective channels.

18. The base socket of claim 15 wherein the outer surface of the base socket is substantially planar and said electrically conductive channels are parallel to one another and run laterally across the upper surface between first and second ends of the base socket.

19. The base socket of claim 15 wherein the outer surface of the base socket is substantially planar and said electrically conductive channels are formed as substantially concentric rings.

20. The base socket of claim 15 wherein the outer surface of the base socket is cylindrical in shape and said electrically conductive channels are formed as peripheral rings around the cylindrical outer surface.

21. The base socket of claim 15 further comprising at least one additional pair of electrically conductive channels adapted to receive respective first and second terminals of an additional plurality of packaged LEDs.

* * * * *